(12) United States Patent
Matsuno et al.

(10) Patent No.: US 11,508,599 B2
(45) Date of Patent: Nov. 22, 2022

(54) PICK-UP DEVICE AND PICK-UP METHOD

(71) Applicant: SHINKAWA LTD., Tokyo (JP)

(72) Inventors: Yasuyuki Matsuno, Tokyo (JP);
Tomonori Nakamura, Tokyo (JP);
Shin Takayama, Tokyo (JP); Hiroshi Omata, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 597 days.

(21) Appl. No.: 16/497,452

(22) PCT Filed: Jan. 30, 2018

(86) PCT No.: PCT/JP2018/002908
§ 371 (c)(1),
(2) Date: Dec. 17, 2019

(87) PCT Pub. No.: WO2018/139667
PCT Pub. Date: Aug. 2, 2018

(65) Prior Publication Data
US 2020/0388521 A1 Dec. 10, 2020

(30) Foreign Application Priority Data
Jan. 30, 2017 (JP) .............................. JP2017-014863

(51) Int. Cl.
*H05F 3/06* (2006.01)
*H01T 19/04* (2006.01)
(Continued)

(52) U.S. Cl.
CPC .......... *H01L 21/6831* (2013.01); *H01L 21/52* (2013.01); *H01T 19/04* (2013.01);
(Continued)

(58) Field of Classification Search
None
See application file for complete search history.

(56) References Cited

U.S. PATENT DOCUMENTS 5,098,501 A * 3/1992 Nishiguchi ....... H01L 21/67132
156/941
5,827,394 A * 10/1998 Lu ........................... B32B 38/10
438/464
(Continued)

FOREIGN PATENT DOCUMENTS

JP H07235583 9/1995
JP 3163973 5/2001
(Continued)

OTHER PUBLICATIONS

"International Search Report (Form PCT/ISA/210)" of PCT/JP2018/002908, dated Mar. 13, 2018, with English translation thereof, pp. 1-4.
(Continued)

*Primary Examiner* — Erik T. K. Peterson
(74) *Attorney, Agent, or Firm* — JCIPRNET

(57) ABSTRACT

A pick-up device 10 for picking up a semiconductor chip 100 attached to a front surface of a sheet material 110 is provided with: a stage 12 that includes a material a part or the entirety of which is capable of transmitting a destaticizing electromagnetic wave having an ionization effect and that attracts and holds a rear surface of the sheet material 110; a jacking-up pin 26 for jacking up the semiconductor chip 100 from the rear side of the stage 12; and a destaticizing mechanism 20 that destaticizes charge generated between the semiconductor chip 100 and the sheet material 110 by irradiating the rear surface of the semiconductor chip 100 with the destaticizing electromagnetic wave that is made to pass through the sheet material 110 from the rear side of the stage 12.

6 Claims, 3 Drawing Sheets

(51) Int. Cl.
 *H05F 3/04* (2006.01)
 *H01L 21/683* (2006.01)
 *H01L 21/52* (2006.01)

(52) U.S. Cl.
 CPC ............... *H05F 3/04* (2013.01); *H05F 3/06* (2013.01); *H01L 2224/83191* (2013.01); *Y10T 156/1917* (2015.01)

(56) References Cited

U.S. PATENT DOCUMENTS

| | | | |
|---|---|---|---|
| 6,174,370 | B1 | 1/2001 | Yoshida |
| 7,759,164 | B2 * | 7/2010 | Maki ................. H01L 21/67132 156/707 |
| 9,401,298 | B2 * | 7/2016 | Zakel ..................... H01L 24/31 |
| 9,849,660 | B2 * | 12/2017 | Eguchi ............. H01L 21/67132 |
| 2002/0024883 | A1 * | 2/2002 | Odashima ........... H01L 21/6836 365/52 |
| 2003/0207497 | A1 * | 11/2003 | Koopmans ........ H01L 21/67132 438/118 |
| 2006/0138443 | A1 * | 6/2006 | Fan .......................... H01L 33/56 257/E33.059 |
| 2007/0267645 | A1 * | 11/2007 | Nakata ................... H01L 33/58 257/E33.059 |
| 2008/0318346 | A1 * | 12/2008 | Maki ................... H01L 21/6836 257/E21.53 |
| 2010/0214712 | A1 * | 8/2010 | Yamawaku ......... H01L 21/6833 361/213 |
| 2014/0338827 | A1 * | 11/2014 | Koller ............... H01L 21/67115 156/247 |
| 2015/0060933 | A1 * | 3/2015 | Ohno ...................... H01L 51/56 29/721 |
| 2016/0049325 | A1 * | 2/2016 | Paramio Joves .... B25J 11/0095 156/247 |
| 2016/0126218 | A1 * | 5/2016 | Kurita ..................... H01L 24/75 156/349 |
| 2016/0278193 | A1 * | 9/2016 | Chen ........................ H05F 3/00 |

FOREIGN PATENT DOCUMENTS

| | | |
|---|---|---|
| JP | 2003124290 | 4/2003 |
| JP | 2004299814 | 10/2004 |
| JP | 2007115979 | 5/2007 |
| JP | 2009064950 | 3/2009 |
| JP | 4458193 | 4/2010 |
| JP | 2010199239 | 9/2010 |

OTHER PUBLICATIONS

Office Action of China Counterpart Application, with partial English translation thereof, dated Oct. 10, 2022, pp. 1-15.

* cited by examiner

PICK-UP DEVICE AND PICK-UP METHOD

CROSS-REFERENCE TO RELATED APPLICATION

This application is a 371 application of the International PCT application serial no. PCT/JP2018/002908, filed on Jan. 30, 2018, which claims priority under 35 U.S.C. § 119 to Japanese Application No. 2017-014863 filed Jan. 30, 2017. The entirety of each of the abovementioned patent applications is hereby incorporated by reference herein and made a cart of this specification.

BACKGROUND

Technical Field

The present application discloses a pick-up device and a pick-up method for picking up a semiconductor chip attached to a front surface of a sheet material.

Description of Related Art

Before bonding, semiconductor chips are aligned and adhere to the front surface of a sheet material such as a dicing sheet. When the semiconductor chip is bonded to a circuit board or the like, it is necessary to pick up the semiconductor chip from the sheet material. When the semiconductor chip is picked up, the target semiconductor chip is jacked up from the rear side of the sheet material, and the semiconductor chip that has been jacked up is attracted and held by a collet or the like.

Here, when the semiconductor chip is peeled off and picked up from the sheet material to which the semiconductor chip is attached, peeling charge may be generated between the semiconductor chip and the sheet material. In particular, if the rear surface of the semiconductor chip is applied with an adhesive composed of resin, peeling charge may easily occur between the semiconductor chip and the sheet material similarly composed of resin. As the rear surface of the semiconductor chip and the front surface of the sheet material are charged, the semiconductor chip may be scattered or electrostatically broken down.

Therefore, it has been proposed to dispose a destaticizing device to neutralize the charge around the semiconductor chip. For example, Patent Document 1 discloses a semiconductor wafer chuck device, which includes an electrostatic chuck for attracting a semiconductor wafer with an electrostatic force, and an ionized gas generating means for neutralizing and destaticizing that remains after the electrostatic force of the electrostatic chuck is released. In Patent Document 1, the ionized gas generating means has a UV light irradiation device that irradiates the wafer from a lateral side and ionizes the inert gas around the wafer.

In addition, Patent Document 2 discloses an electronic component packaging device provided with a destaticizing means for removing charge charged at a peeling portion where a top tape covering the upper surface of a tape is peeled off from the tape, which holds an electronic component. In Patent Document 2, the destaticizing means is a destaticizer that is arranged above the top tape and injects ionized air to the peeling portion. Although not specified in Patent Document 2, it is assumed that the ionized air is generated using corona discharge.

RELATED ART

Patent Document

[Patent Document 1] Japanese Patent No. 3163973
[Patent Document 2] Japanese Patent No. 4458193

SUMMARY

Problems to be Solved

By using such a destaticizing device, the charge around the semiconductor chip can be reduced to some extent. However, most of the conventional destaticizing devices are provided on the upper side or a lateral side of the semiconductor chip. For this reason, in the conventional art, the rear surface of the semiconductor chip, that is, the junction between the sheet material and the rear surface of the semiconductor chip cannot be efficiently destaticized. As a result, the semiconductor chip may be scattered or electrostatically broken down by the electrostatic force.

Further, in order to destaticize to the rear surface of the semiconductor chip, it is also conceivable to blow ionized air generated by corona discharge to the rear surface of the semiconductor chip. In that case, however, there is another problem, which is that blowing air may cause the semiconductor chip to be scattered.

Therefore, the present application discloses a pick-up device and a pick-up method that can more appropriately pick up a semiconductor chip.

Means for Solving the Problems

A pick-up device disclosed in the present application is for picking up a semiconductor chip attached to a front surface of a sheet material. The pick-up device includes: a stage including a material a part or all of which is capable of transmitting a destaticizing electromagnetic wave having an ionization effect, and attracting and holding a rear surface of the sheet material; a jacking-up pin jacking up the semiconductor chip from a rear side of the stage; and a destaticizing mechanism destaticizing charge generated between the semiconductor chip and the sheet material by making the destaticizing electromagnetic wave pass through the sheet material from the rear side of the stage and irradiate a rear surface of the semiconductor chip.

With this configuration, it is able to destaticize the area around the rear surface of the semiconductor chip without wind, and it is able to effectively prevent the semiconductor chip from being scattered by the electrostatic force or destaticizing wind and prevent the semiconductor chip from being electrostatically broken down by the electrostatic force. As a result, the semiconductor chip can be picked up more appropriately.

The pick-up device further includes a suction cylinder covering a periphery of the jacking-up pin and formed with an irradiation hole on a peripheral surface for the destaticizing electromagnetic wave to pass through. The destaticizing mechanism may include a light source that irradiates the semiconductor chip with the destaticizing electromagnetic wave via the irradiation hole.

By irradiating the semiconductor chip with the destaticizing electromagnetic wave via the irradiation hole, it is not necessary to arrange a light source inside the suction cylinder, and the configuration can be simplified.

In addition, the destaticizing mechanism may emit the destaticizing electromagnetic wave that has photon energy in a range of 3 eV to 15 keV.

With this configuration, it is able to destaticize while suppressing adverse effects on the human body, etc.

In addition, the destaticizing mechanism emits the destaticizing electromagnetic wave that has photon energy in an ultraviolet ray region, and the stage may include quartz, calcium fluoride, or magnesium fluoride. Besides, the destaticizing mechanism emits the destaticizing electromagnetic wave that has photon energy in an X-ray region, and a part or all of the stage may include beryllium and diamond. Furthermore, the destaticizing mechanism emits the destaticizing electromagnetic wave that has photon energy in an X-ray region, and a part or all of the stage may be made of a metal material or a non-metal material that controls transmissibility to the destaticizing electromagnetic wave by thickness.

With this configuration, the destaticizing electromagnetic wave can pass through the stage and reach the semiconductor chip.

A pick-up method disclosed in the present application is for picking up a semiconductor chip attached to a front surface of a sheet material. The pick-up method includes: a step of attracting and holding the sheet material at a stage including a material that is capable of transmitting a destaticizing electromagnetic wave having an ionization effect; a step of jacking up the semiconductor chip from a rear side of the stage with a jacking-up pin and peeling off at least a part of the semiconductor chip from the sheet material; and a step of destaticizing charge generated between the semiconductor chip and the sheet material by making the destaticizing electromagnetic wave pass through the sheet material from the rear side of the stage and irradiate a rear surface of the semiconductor chip in parallel with or immediately after the step of jacking up.

With this configuration, it is able to destaticize the area around the rear surface of the semiconductor chip without wind, and it is able to effectively prevent the semiconductor chip from being scattered by the electrostatic force or destaticizing wind and prevent the semiconductor chip from being electrostatically broken down by the electrostatic force. As a result, the semiconductor chip can be picked up more appropriately.

Effects

With the pick-up device and the pick-up method disclosed in the present application, it is able to destaticize the area around the rear surface of the semiconductor chip without wind, and it is able to effectively prevent the semiconductor chip from being scattered by an electrostatic force or destaticizing wind and prevent the semiconductor chip from being electrostatically broken down by an electrostatic force. As a result, the semiconductor chip can be picked up more appropriately.

DESCRIPTION OF THE EMBODIMENTS

Figure 1:
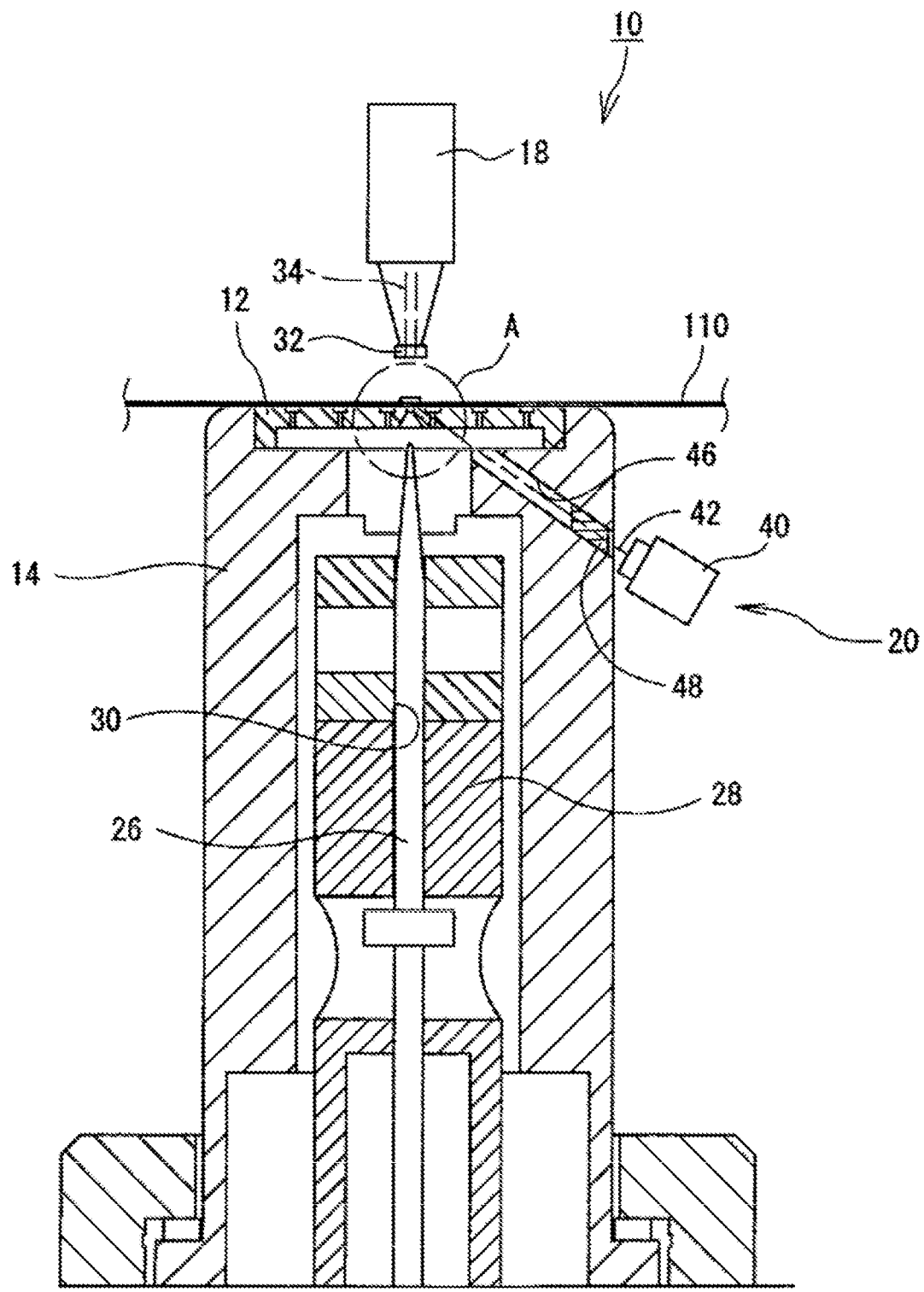
FIG. 1 is a diagram showing the configuration of a pick-up device.
Figure 2:
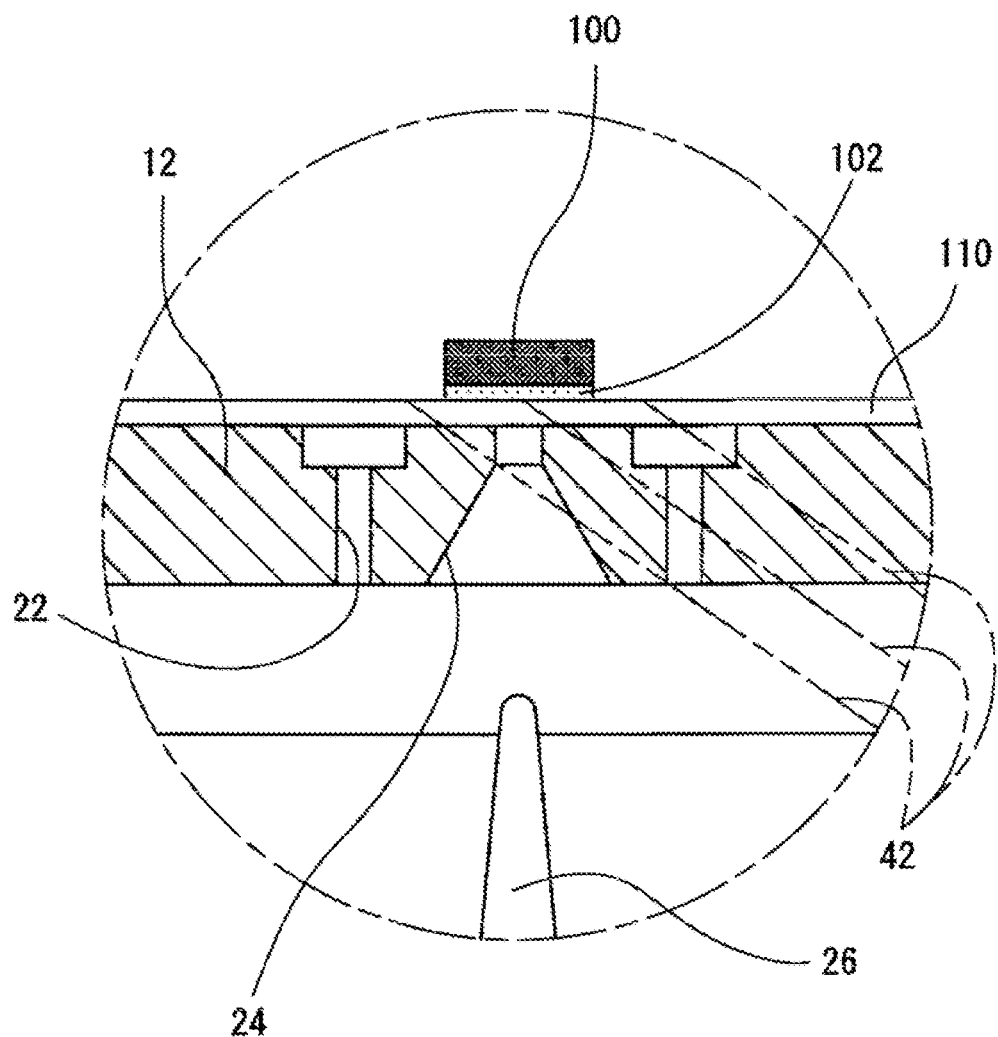
FIG. 2 is an enlarged diagram of the part A of FIG. 1.

Hereinafter, a pick-up device 10 will be described with reference to the drawings. FIG. 1 is a diagram showing the configuration of the pick-up device 10. In addition, FIG. 2 is an enlarged diagram of a part A of FIG. 1. The pick-up device 10 includes: a suction stage 12 that attracts and holds a sheet material 110 with a semiconductor chip 100 attached thereto, a jacking-up mechanism 16 that jacks up any semiconductor chip 100 on the suction stage 12 at a predetermined timing, a collet 18 that sucks and holds the semiconductor chip 100 to convey the semiconductor chip 100, and a destaticizing mechanism 20 that destaticizes by generating ion pairs around the semiconductor chip 100.

The sheet material 110 is a plastic sheet that adheres and holds the semiconductor chip 100 and is generally called a dicing sheet or a wafer sheet. The material of the sheet material 110 is not limited as long as it is capable of transmitting a destaticizing electromagnetic wave having an ionization effect, such as an ultraviolet ray and a soft X-ray. For example, the sheet material 110 is composed of vinyl chloride resin or the like. A plurality of semiconductor chips 100 are aligned and attached to the front surface of the sheet material 110.

The semiconductor chip 100 has a plurality of bumps (not shown) formed on the bottom surface. Further, a non-conductive adhesive film 102 is attached to the bottom surface of the semiconductor chip 100 in such a manner as to cover the bumps. The adhesive film 102 is called a die attach film (DAF) or a wafer bonding coating (WBC), for example.

The suction stage 12 is a substantially flat plate-shaped member formed with a plurality of suction holes 22 and one or more jacking-up holes 24. The suction stage 12 includes a material that is capable of transmitting an ultraviolet ray and a soft X-ray, which are destaticizing electromagnetic waves, such as quartz, calcium fluoride, magnesium fluoride, and the like.

A substantially cylindrical suction cylinder 14 is disposed in close contact with the rear surface of the suction stage 12. The suction cylinder 14 is a cylindrical member having an opening at its upper end, and its lower end is connected to a suction pump (not shown). The sheet material 110 is sucked and held via the suction cylinder 14 and the suction holes 22. The jacking-up hole 24 is a hole that allows a jacking-up pin 26, which will be described later, to pass through. When the semiconductor chip 100 is picked up, the position of the sheet material 110 is adjusted in such a manner that the semiconductor chip 100 to be picked up is positioned right above the jacking-up hole 24. In other words, the position where the jacking-up hole 24 is provided is a pick-up position where the semiconductor chip 100 is to be picked up.

The jacking-up pin 26 that constitutes the jacking-up mechanism 16 is provided inside the suction cylinder 14. The jacking-up pin 26 is a pin that peels off at least a part of the semiconductor chip 100 from the sheet material 110 by jacking the semiconductor chip 100 upward. The jacking-up pin 26 is arranged coaxially with the jacking-up hole 24, and at the time of picking up, the collet 18, the semiconductor chip 100, the jacking-up hole 24, and the jacking-up pin 26 are arranged vertically in this order from the top.

A pin holder 28 that holds the jacking-up pin 26 is also provided inside the suction cylinder 14. The pin holder 28 is formed with a guide hole 30, into which the jacking-up pin 26 is inserted and which guides the rising and lowering of the jacking-up pin 26. Then, the jacking-up pin 26 can be moved up and down along the guide hole 30 by a lifting mechanism (not shown). A plunger, a cam mechanism or the like can be used as the lifting mechanism.

Here, only one jacking-up pin 26 is used, but a plurality of jacking-up pins 26 may be provided. That is, in the case of peeling off a large semiconductor chip 100 or the like, the jacking-up pins 26 arranged in the horizontal direction may jack up sequentially by shifting the timings or the rising amounts. In addition, the jacking-up pin 26 may be movable in the horizontal direction so that the jacking-up position of the semiconductor chip 100 can be changed as appropriate.

The collet 18 picks up the semiconductor chip 100 at the pick-up position and sucks and holds the semiconductor chip 100, and conveys the semiconductor chip 100 to the next working position, such as a positioning position for adjusting the inclination of the chip. The collet 18 is provided on the side opposite to the jacking-up pin 26 with the semiconductor chip 100 interposed therebetween. The collet 18 is a cylindrical member having a tip part 32 for holding the semiconductor chip 100, and a through hole 34 that is open at the tip part 32. A vacuum source (not shown) is connected to the through hole 34. In addition, the collet 18 can move in the vertical direction and the horizontal direction by a moving mechanism (not shown). A mechanism provided with a motor and a guide rail, for example, can be used as the moving mechanism. The semiconductor chip 100 is jacked up by the jacking-up pin 26 and peeled off from the sheet material 110, and then sucked and held by the collet 18. If the collet 18 sucks and holds the semiconductor chip, the collet 18 rises and moves to convey the semiconductor chip.

The destaticizing mechanism 20 includes a light source 40 arranged on a lateral side of the suction cylinder 14. The light source 40 irradiates the rear surface (surface in contact with the sheet material 110) of the semiconductor chip 100 with an electromagnetic wave 42 having an ionization effect (hereinafter, referred to as "destaticizing electromagnetic wave 42"), such as an electromagnetic wave having photon energy of 3 eV to 15 keV including an ultraviolet ray region or an X-ray region. When an ultraviolet ray is used, it is desirable to use a vacuum ultraviolet ray (far ultraviolet ray) having a wavelength of 10 nm to 200 nm (photon energy of 6 eV to 123 eV). In addition, specifically, the values of photon energy are 3, 4, 5, 6, 7, 8, 9, 10, 11, 12, 13, 14, 15, 16, 17, 18, 19, 20 (units Are "eV"), or may be within the range between any of these values. In addition, in the case of an X-ray, it is desirable to use a soft X-ray having a wavelength of several tenths to several tens of nm (the energy is 0.1 keV to 2 keV). In addition, specifically, the values of the energy of the soft X-rays are 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, 2.0 (units are "keV"), or may be within the range between any of these values. The reason why a soft X-ray is used is that it has an ionization effect, and on the other hand, it has low transmissibility and can be shielded by a polyvinyl chloride plate of several millimeters and can prevent adverse effects on the human body, etc. The sheet material 110 to which the semiconductor chip 100 is attached includes plastic such as polyvinyl chloride. However, since the sheet material 110 is as thin as several tens to several hundreds of it is capable of transmitting a soft X-ray.

An irradiation hole 46 for guiding the electromagnetic wave emitted from the light source 40 to the vicinity of the semiconductor chip 100 is formed on the peripheral wall of the suction cylinder 14. That is, the irradiation hole 46 extends along a straight line that connects the emission point of the electromagnetic wave and the bottom surface of the semiconductor chip 100. The light source 40 emits the electromagnetic wave at a level that passes through the irradiation hole 46 and reaches the bottom surface of the semiconductor chip 100. The inner peripheral surface of the irradiation hole 46 may be coated with a shielding material such as metal in order to inhibit the transmission and absorption of the electromagnetic wave. Moreover, in order to prevent air leakage from the irradiation hole 46, it is desirable to close the irradiation hole 46 with a closure member 48 that includes a material capable of transmitting the destaticizing electromagnetic wave 42, such as quartz, calcium fluoride, and magnesium fluoride.

In addition, when an X-ray is used as the destaticizing electromagnetic wave 42, beryllium or diamond that is highly capable of transmitting the X-ray can be used in the closure member 48. Furthermore, a metal material or a non-metal material whose thickness is adjusted to have the same transmissibility as beryllium or diamond may also be used in the closure member 48.

The light source 40 may emit the destaticizing electromagnetic wave 42 constantly during the pick-up process or only emit the destaticizing electromagnetic wave 42 immediately after the semiconductor chip 100 is jacked up by the jacking-up pin 26.

Figure 3A:
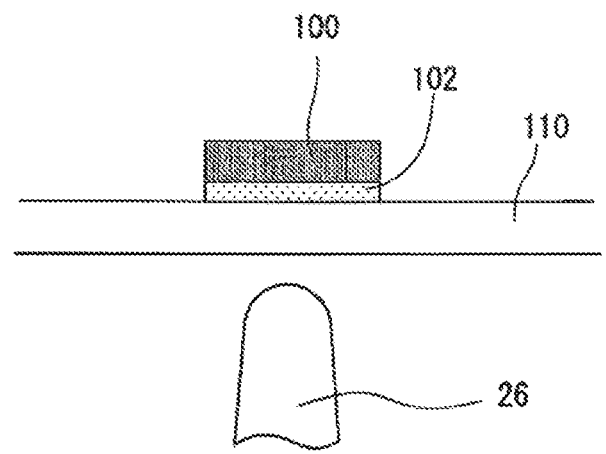
FIG. 3(a) to FIG. 3(c) are image diagrams showing the states of picking up.
Figure 3B:
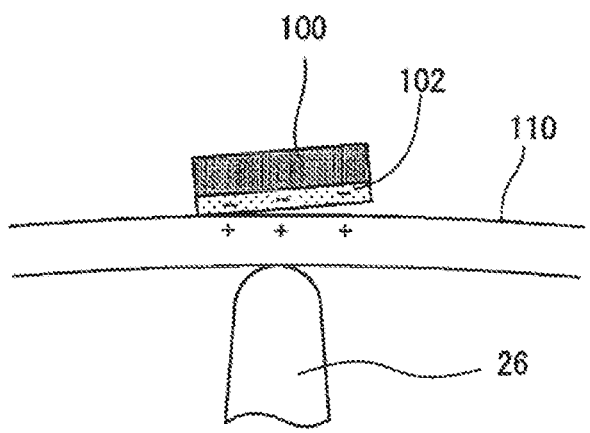
Figure 3C:
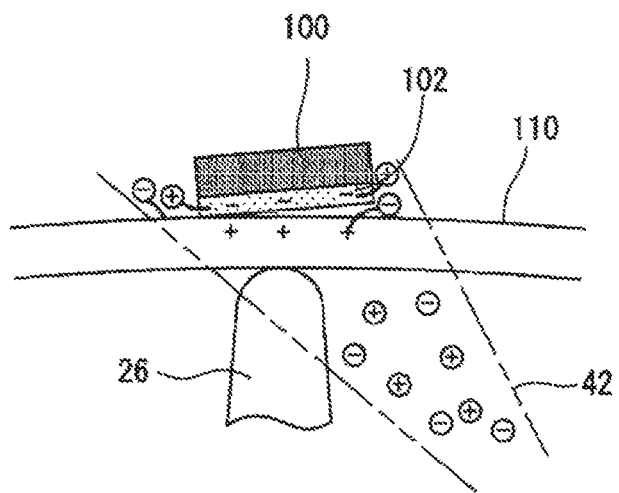

Next, the reason for disposing the destaticizing mechanism 20 in such a manner will be described through comparison with the conventional art. FIG. 3(a) to FIG. 3(c) are image diagrams showing the states of picking up. As described above, when the semiconductor chip 100 is picked up, as shown in FIG. 3(a) and FIG. 3(b), the semiconductor chip 100 is jacked up by the jacking-up pin 26 from the rear side of the sheet material 110, and at least a part of the semiconductor chip 100 is peeled off from the sheet material 110. If at least a part of the semiconductor chip 100 is peeled off from the sheet material 110, the collet 18 is lowered to suck and hold the semiconductor chip 100 from the upper side.

Here, when a part of the semiconductor chip 100 is peeled off from the sheet material 110 by the jacking up, peeling charge is generated on the rear surface of the semiconductor chip 100 (the end surface of the adhesive film 102) and the front surface of the sheet material 110. As a result, the rear surface of the semiconductor chip 100 and the front surface of the sheet material 110 are charged positively or negatively. When such charge occurs, the semiconductor chip 100 may be scattered or electrostatically broken down by the electrostatic force.

Therefore, the conventional art has proposed to destaticize the area around the semiconductor chip 100. However, in the conventional art, the semiconductor chip 100 is destaticized from the upper side of the semiconductor chip 100. For this reason, the rear surface of the semiconductor chip 100 and the front surface of the sheet material 110 where peeling charge is most likely to occur cannot be destaticized efficiently.

In addition, the conventionally provided destaticizing mechanism 20 has a configuration that blows ion pairs (ionized air) generated by corona discharge to the portion to be destaticized (in this example, the area around the semiconductor chip 100). In this case, another problem is caused, which is that the semiconductor chip 100 may be scattered by the wind that blows the ion pairs.

In the pick-up device 10 disclosed in the present application, as described above, the rear surface (the surface in contact with the sheet material 110) of the semiconductor chip 100 is irradiated with the destaticizing electromagnetic wave 42 having an ionization effect. Although the suction stage 12 (not shown in FIG. 3(a) to FIG. 3(c)) is present behind the sheet material 110, as described above, the suction stage 12 includes quartz, calcium fluoride, and magnesium fluoride that are capable of transmitting the destaticizing electromagnetic wave 42. Alternatively, it may include a material with an adjusted thickness. Further, although the sheet material 110 is composed of resin such as polyvinyl chloride, since these are sufficiently thin, the destaticizing electromagnetic wave 42 can pass through. As a result, the destaticizing electromagnetic wave 42 can reach the rear surface of the semiconductor chip 100.

As shown in FIG. 3(c), the air in the range irradiated by the destaticizing electromagnetic wave 42 is ionized by the ionization effect of the destaticizing electromagnetic wave 42 to generate bipolar ions. That is, electrons are blown off from stable atoms/molecules by the ionization effect of the destaticizing electromagnetic wave. The atoms/molecules from which electrons are blown off become positive ions, and the atoms/molecules bonded to the blown electrons become negative ions. The ion pairs generated in this manner are attracted to the semiconductor chip 100 and the sheet material 110, which are the charged bodies, to remove static electricity.

Thus, in the pick-up device 10 disclosed in the present application, the rear surface of the semiconductor chip 100 and the front surface of the sheet material 110 that are charged easily are irradiated with the destaticizing electromagnetic wave 42. Therefore, compared with the conventional art that tried to destaticize from the upper side or a lateral side of the semiconductor chip 100, the pick-up device 10 can destaticize more effectively, and therefore effectively prevent the semiconductor chip 100 from being scattered or electrostatically broken down by an electrostatic force.

In addition, unlike destaticization using corona discharge, the destaticization using the destaticizing electromagnetic wave 42, that is, optical destaticization, does not require wind. Therefore, the semiconductor chip 100 and dust are prevented from being scattered by wind. As a result, scattering and contamination of the semiconductor chip 100 can be prevented more reliably, and the semiconductor chip 100 can be picked up more appropriately.

The collet 18 sucks and holds the destaticized semiconductor chip 100 from the upper side and conveys the semiconductor chip 100 to the working site in the downstream process. When the semiconductor chip 100 is out of the radiation range of the destaticizing electromagnetic wave 42, the ionized atoms/molecules all return to stable atoms/molecules. In other words, in the optical destaticization using the destaticizing electromagnetic wave 42, there is no reverse charging with a biased ion balance or residual charging with ionized atoms/molecules remaining, and there is no adverse effect on the subsequent process.

It is clear from the above description that the pick-up device 10 disclosed in the present application can pick up the semiconductor chip 100 more appropriately. Nevertheless, the configuration described so far is an example, and other configurations may be changed as appropriate as long as the rear surface of the semiconductor chip 100 is irradiated with the destaticizing electromagnetic wave 42 and destaticized from the rear side of the sheet material 110. For example, in the above description, the light source 40 is arranged on a lateral side of the suction cylinder 14, but it may also be arranged at other locations, for example, inside the suction cylinder 14, if there is no interference with other members. Further, in the example described above, the optical path of the destaticizing electromagnetic wave 42 is a straight line that does not bend, but a reflective member may be provided in the middle of the optical path as appropriate to bend the optical path. Besides the suction stage 12, at least a part of the suction cylinder 14 and the jacking-up pin 26 may also be made of a material that is capable of transmitting the destaticizing electromagnetic wave 42.

What is claimed is:

1. A pick-up device for picking up a semiconductor chip attached to a front surface of a sheet material, the pick-up device comprising:
    a stage comprising a material a part or all of which is capable of transmitting a destaticizing electromagnetic wave having an ionization effect, and the stage attracting and holding a rear surface of the sheet material;
    a jacking-up pin jacking up the semiconductor chip from a rear side of the stage;
    a destaticizing mechanism destaticizing charge generated between the semiconductor chip and the sheet material by making the destaticizing electromagnetic wave pass through the sheet material from the rear side of the stage and irradiate a rear surface of the semiconductor chip; and
    a suction cylinder covering a periphery of the jacking-up pin and formed with an irradiation hole on a peripheral surface for the destaticizing electromagnetic wave to pass through,
    wherein the destaticizing mechanism comprises a light source that irradiates the semiconductor chip with the destaticizing electromagnetic wave via the irradiation hole.

2. The pick-up device according to claim 1, wherein the destaticizing mechanism emits the destaticizing electromagnetic wave that has photon energy in a range of 3 eV to 15 keV.

3. The pick-up device according to claim 1, wherein the destaticizing mechanism emits the destaticizing electromagnetic wave that has photon energy in an ultraviolet ray region, and
    the stage comprises quartz, calcium fluoride, or magnesium fluoride.

4. The pick-up device according to claim 1, wherein the destaticizing mechanism emits the destaticizing electromagnetic wave that has photon energy in an X-ray region, and
    a part or all of the stage comprises beryllium and diamond.

5. The pick-up device according to claim 1, wherein the destaticizing mechanism emits the destaticizing electromagnetic wave that has photon energy in an X-ray region, and
    a part or all of the stage is made of a metal material or a non-metal material that controls transmissibility to the destaticizing electromagnetic wave by thickness.

6. A pick-up method for picking up a semiconductor chip attached to a front surface of a sheet material, the pick-up method comprising:
    a step of attracting and holding the sheet material at a stage, wherein the stage comprises a material that is capable of transmitting a destaticizing electromagnetic wave having an ionization effect;
    a step of jacking up the semiconductor chip from a rear side of the stage with a jacking-up pin and peeling off at least a part of the semiconductor chip from the sheet material; and
    a step of destaticizing charge generated between the semiconductor chip and the sheet material by making the destaticizing electromagnetic wave pass through the sheet material from the rear side of the stage and irradiate a rear surface of the semiconductor chip in parallel with or immediately after the step of jacking up wherein the destaticizing electromagnetic wave is irradiated to the semiconductor chip via an irradiation hole formed on a peripheral surface of a suction cylinder covering a periphery of the jacking-up pin.

\* \* \* \* \*